United States Patent
Matsuda et al.

(10) Patent No.: US 9,851,634 B2
(45) Date of Patent: Dec. 26, 2017

(54) IMPRINT APPARATUS

(71) Applicant: CANON KABUSHIKI KAISHA, Tokyo (JP)

(72) Inventors: Yozo Matsuda, Utsunomiya (JP); Noriyasu Hasegawa, Utsunomiya (JP); Mitsuru Hiura, Utsunomiya (JP); Tatsuya Hayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 614 days.

(21) Appl. No.: 14/372,938

(22) PCT Filed: Jan. 25, 2013

(86) PCT No.: PCT/JP2013/000400
§ 371 (c)(1),
(2) Date: Jul. 17, 2014

(87) PCT Pub. No.: WO2013/111606
PCT Pub. Date: Aug. 1, 2013

(65) Prior Publication Data
US 2015/0001751 A1    Jan. 1, 2015

(30) Foreign Application Priority Data

Jan. 27, 2012  (JP) .................................. 2012-015558
Jan. 18, 2013  (JP) .................................. 2013-006827

(51) Int. Cl.
*G03F 7/00*   (2006.01)
*G03F 9/00*   (2006.01)
(Continued)

(52) U.S. Cl.
CPC .......... *G03F 7/0002* (2013.01); *B29C 59/002* (2013.01); *B29C 59/16* (2013.01);
(Continued)

(58) Field of Classification Search
CPC ............................................. B29C 2035/0822
See application file for complete search history.

(56) References Cited

U.S. PATENT DOCUMENTS 6,366,341 B1   4/2002  Shirato et al.
7,323,130 B2   1/2008  Nimmakayala et al.
(Continued)

FOREIGN PATENT DOCUMENTS

CN    1940729 A      4/2007
JP    2001060546 A   3/2001
(Continued)

OTHER PUBLICATIONS

Official Action issued in Japanese Appln. No. 2013006827 dated Feb. 23, 2016. English translation provided.
(Continued)

*Primary Examiner* — Benjamin A Schiffman
(74) *Attorney, Agent, or Firm* — Rossi, Kimms & McDowell LLP

(57) ABSTRACT

An imprint apparatus forms a pattern of a resin on a region to be processed of a substrate using a mold including a pattern region on which a pattern is formed and includes a correction unit configured to correct a shape of a target region that is either the pattern region on the mold or the region to be processed on the substrate, wherein the correction unit further includes: a heating unit configured to heat an object corresponding to the target region of either the mold or the substrate in a heating region having an area smaller than that of the pattern region on the mold; a scanning unit configured to scan the heating region with respect to the target region by changing the relative position of the target region and the heating region; and a control unit configured to acquire information regarding a correction (Continued)

deformation amount of the target region and control the heating unit and the scanning unit based on the information.

11 Claims, 7 Drawing Sheets

(51) Int. Cl.
   *B82Y 10/00* (2011.01)
   *B82Y 40/00* (2011.01)
   *B29C 59/00* (2006.01)
   *B29C 59/16* (2006.01)
   *B29C 59/02* (2006.01)

(52) U.S. Cl.
   CPC ............... *B82Y 10/00* (2013.01); *B82Y 40/00* (2013.01); *G03F 9/7003* (2013.01); *G03F 9/7042* (2013.01); *G03F 9/7065* (2013.01); *B29C 2059/023* (2013.01)

(56) References Cited

U.S. PATENT DOCUMENTS

| | | | |
|---|---|---|---|
| 7,440,076 B2 | 10/2008 | Kuit et al. | |
| 7,807,065 B2 | 10/2010 | Tokita et al. | |
| 7,927,089 B2 | 4/2011 | Seki et al. | |
| 8,845,317 B2 | 9/2014 | Suehira et al. | |
| 2006/0279022 A1 | 12/2006 | Seki et al. | |
| 2011/0273684 A1 | 11/2011 | Owa et al. | |

FOREIGN PATENT DOCUMENTS

| | | | |
|---|---|---|---|
| JP | 2004-259985 A | 9/2004 | |
| JP | 2004-335808 A | 11/2004 | |
| JP | 2006-510223 A | 3/2006 | |
| JP | 2007-015375 A | 1/2007 | |
| JP | 2007-165400 A | 6/2007 | |
| JP | 2010034210 A | 2/2010 | |
| KR | 1020090009874 A | 1/2009 | |
| WO | 2009/153925 A1 | 12/2009 | |

OTHER PUBLICATIONS

Notice of Allowance issued in Korean Appln. No. 10-2014-7020115 dated Jun. 22, 2016.

International Search Report for corresponding PCT/JP2013/000400, dated May 7, 2013.

Notification of the Transmittal of the International Search Report and the Written Opinion of the International Searching Authority, or the Declaration for corresponding PCT/JP2013/000400, dated May 7, 2013.

Chinese Office Action issued in counterpart application No. CN201380006253.3, dated Dec. 14, 2015. English translation provided.

Decision to Grant a Patent issued in Japanese Appln. No. 2013-006827 dated Oct. 18, 2016. English machine translation provided.

IMPRINT APPARATUS

TECHNICAL FIELD

The present invention relates to an imprint apparatus and an article manufacturing method using the same.

BACKGROUND ART

As the demand for microfabrication of semiconductor devices or MEMS increases, not only a conventional photolithography technology but also a microfabrication technology in which a resin on a substrate is molded by a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint material, photocurable resin) to a region to be processed on a substrate. Next, the resin is molded by a mold. After the ultraviolet curable resin is irradiated with ultraviolet light for curing, the cured resin is released from the mold, whereby a resin pattern is formed on the region to be processed.

Here, in a series of device manufacturing steps, heat processing in a film formation step such as sputtering is performed on a substrate to be subject to imprint processing. Consequently, the entire substrate may be expanded or reduced, resulting in a change in the shape of the region to be processed within a plane. During imprint processing, the patterns formed in multiple layers need to be accurately superposed to each other, and thus, the change in shape of a region to be processed may deteriorate superposition accuracy. Thus, in an imprint apparatus, the shape of a region to be processed on a substrate needs to be matched with the shape of the pattern region formed on a mold when the mold is pressed against the resin on the substrate. As a technique for making the shape of a region to be processed on a substrate match the shape of the pattern region formed on a mold, for example, there is a method for correcting the shape of the pattern region by deforming the mold itself by providing temperature distribution to the mold by irradiating the mold collectively with light. As the shape correction method, Patent Literature 1 discloses a resist pattern forming apparatus that provides temperature distribution to the pattern region on a mold or the region to be processed on a substrate by use of a light source. Furthermore, Patent Literature 2 discloses an imprint apparatus that provides temperature distribution to a pattern region on a mold by use of a plurality of optical fibers.

CITATION LIST

Patent Literature

[Patent Literature 1] Japanese Patent Laid-Open No. 2004-259985

[Patent Literature 2] WO 2009/153925

However, in the imprint apparatuses disclosed in Patent Literatures 1 and 2, temperature distribution is provided to a pattern region by collectively irradiating the entire surface of the pattern region with light upon correcting the shape of the pattern region on the mold. Consequently, a complex optical system for guiding light to a pattern region is needed, resulting in an increase in cost and difficulty in terms of design.

SUMMARY OF INVENTION

The present invention provides an imprint apparatus that is advantageous for simplifying a mechanism for thermally correcting the shape of a region to be processed on a substrate or the shape of a pattern region formed on a mold.

According to an aspect of the present invention, an imprint apparatus that forms a pattern of a resin on a region to be processed of a substrate using a mold including a pattern region on which a pattern is formed includes a correction unit configured to correct a shape of a target region that is either the pattern region on the mold or the region to be processed on the substrate, wherein the correction unit further includes: a heating unit configured to heat an object corresponding to the target region of either the mold or the substrate in a heating region having an area smaller than that of the pattern region on the mold; a scanning unit configured to scan the heating region with respect to the target region by changing the relative position of the target region and the heating region; and a control unit configured to acquire information regarding a correction deformation amount of the target region and control the heating unit and the scanning unit based on the information.

According to the present invention, an imprint apparatus that is advantageous for simplifying a mechanism for thermally correcting the shape of a region to be processed on a substrate or the shape of a pattern region formed on a mold may be provided.

Further features of the present invention will become apparent from the following description of exemplary embodiments with reference to the attached drawings.

DESCRIPTION OF EMBODIMENTS

Hereinafter, preferred embodiments of the present invention will be described with reference to the drawings.

First Embodiment

Figure 1:
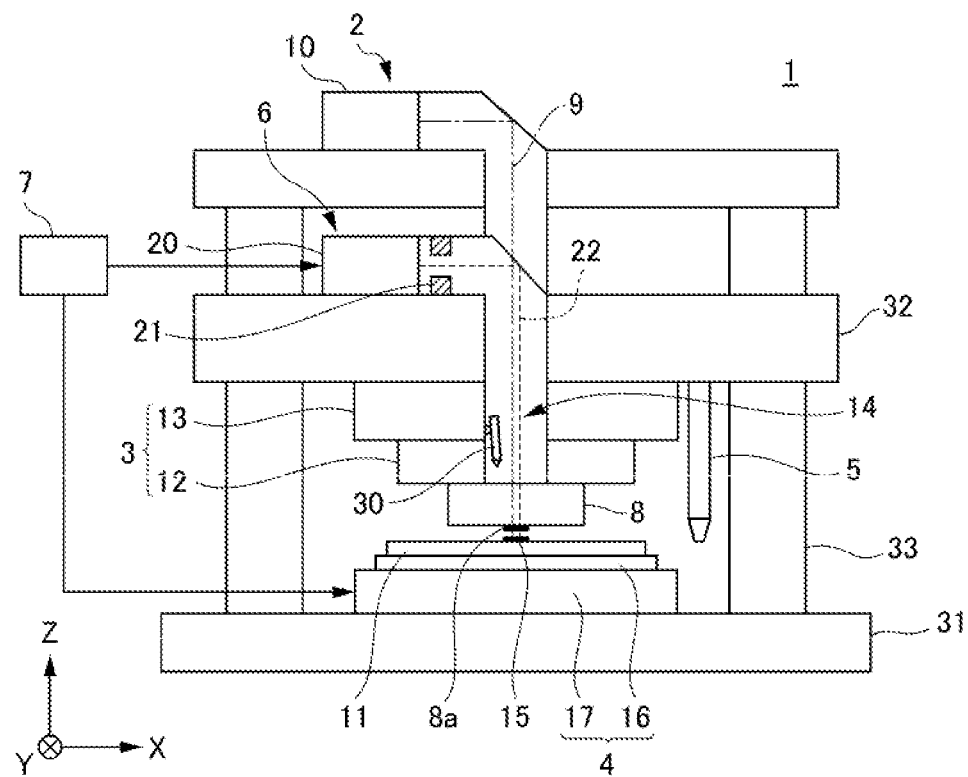
FIG. 1 is a diagram illustrating the configuration of an imprint apparatus according to a first embodiment of the present invention.

Firstly, a description will be given of the configuration of an imprint apparatus according to a first embodiment of the present invention. FIG. 1 is a schematic diagram illustrating the configuration of an imprint apparatus 1 of the present embodiment. The imprint apparatus 1 is an apparatus that molds an uncured resin on a wafer (on a substrate), i.e., a substrate to be treated, using a mold to thereby form a resin pattern on the wafer, which is used in the manufacture of devices such as semiconductor devices and the like as articles. While a description will be given of an imprint apparatus employing a photo-curing method, the present invention is also applicable to an imprint apparatus employing a heat-curing method. In the following drawings, a description will be given where the Z axis is aligned parallel to the optical axis of an irradiation system that irradiates a resin on a wafer with ultraviolet light, and mutually orthogonal axes X and Y are aligned in a plane perpendicular to the Z axis. Firstly, the imprint apparatus 1 includes a light irradiation unit 2, a mold holding mechanism 3, a wafer stage 4, an application unit 5, a heating mechanism 6, and a control unit 7.

The light irradiation unit 2 irradiates a mold 8 with ultraviolet light 9 during imprint processing. The light irradiation unit 2 is constituted by a light source (light source for curing a resin) 10 and an optical element (not shown) that adjusts the ultraviolet light 9 emitted from the light source 10 to light suitable for imprint.

The outer peripheral shape of the mold 8 is a polygon (preferably, rectangular or square) and the mold 8 includes a pattern region (e.g., the concave and convex pattern of a circuit pattern or the like to be transferred) 8a, which is three-dimensionally formed on the surface opposite to a wafer 11. Also, the material of the mold 8 is a material through which the ultraviolet light 9 can pass and, as an example in the present embodiment, is quartz. Furthermore, the mold 8 may be of a shape in which a cavity (concave portion) of a circular planer shape having a certain depth is formed on the surface on which the ultraviolet light 9 is irradiated.

The mold holding mechanism (mold holding unit) 3 has a mold chuck 12 that holds the mold 8 and a mold drive mechanism 13 that holds the mold chuck 12 and moves the mold 8 (the mold chuck 12). The mold chuck 12 may hold the mold 8 by or attracting the outer peripheral region of the surface of the mold 8 to be irradiated with the ultraviolet light 9 using a vacuum suction force or an electrostatic force. For example, when the mold chuck 12 holds the mold 8 using a vacuum suction force, the mold chuck 12 is connected to an externally installed vacuum pump (not shown), and attachment/detachment of the mold 8 is switched by turning the vacuum pump ON/OFF. Also, each of the mold chuck 12 and the mold drive mechanism 13 has an aperture region 14 at the central portion (the inside thereof) such that the ultraviolet light 9 emitted from the light irradiation unit 2 is irradiated toward the wafer 11. A light transmission member (e.g. glass plate) is installed within the aperture region 14 such that a space enclosed by a part of the aperture region 14 and the mold 8 is sealed, and the pressure in the space is adjusted by a pressure adjusting device (not shown) including a vacuum pump or the like. The pressure adjusting device sets the pressure in the space higher than the external pressure when the mold 8 is pressed against a resin 15 on the wafer 11 so that the pattern region 8a is deflected into a convex shape toward the wafer 11 and the pattern region 8a is brought into contact with the resin 15 from the central portion of the pattern region 8a. With this arrangement, gas (air) is prevented from being entrapped between the pattern region 8a and the resin 15 so that the resin 15 can be filled in the every corner of the convex and concave pattern of the pattern region 8a.

The mold drive mechanism 13 moves the mold 8 in each axis direction so as to selectively press the mold 8 against the resin 15 on the wafer 11 or release the mold 8 from the resin 15. Examples of a power source employable for the mold drive mechanism 13 include a linear motor, an air cylinder, and the like. Also, the mold drive mechanism 13 may be constituted by a plurality of drive systems such as a coarse movement drive system, a fine movement drive system, and the like in order to accommodate positioning of the mold 8 with high accuracy. Furthermore, the mold drive mechanism 13 may have a position adjustment function for adjusting the position of the mold 8 not only in the Z-axis direction but also in the X-axis direction, the Y-axis direction, or the θ (rotation about the Z axis) direction, a tilt function for correcting the tilt of the mold 8, and the like. The pressing operation and the releasing operation performed by the imprint apparatus 1 may be realized by moving the mold 8 in the Z-axis direction, may be realized by moving the wafer stage 4 in the Z-axis direction, or may also be realized by moving both the mold 8 and the wafer stage 4 relative to each other.

The wafer 11 is, for example, a single crystal silicon substrate or a SOI (Silicon on Insulator) substrate, and an ultraviolet curable resin, i.e., the resin 15, which is molded by the pattern region 8a formed on the mold 8, is applied on the treatment surface of the wafer 11.

The wafer stage 4 holds the wafer 11 and executes position matching between the mold 8 and the resin 15 when the mold 8 is pressed against the resin 15 on the wafer 11. The wafer stage 4 has a wafer chuck 16 that holds the wafer 11 by a suction force and a stage drive mechanism (moving body driving unit) 17 that drives a moving body including the wafer chuck 16 in each axial direction. Examples of a power source employable for the stage drive mechanism 17 include a linear motor, a planar motor, and the like. The stage drive mechanism 17 may also be constituted by a plurality of drive systems such as a coarse movement drive system, a fine movement drive system, and the like in the X-axis and Y-axis directions. Furthermore, the stage drive mechanism 17 may also have a drive system for adjusting the position of the wafer 11 in the Z-axis direction, a position adjustment function for adjusting the position of the wafer 11 in the θ direction, a tilt function for correcting the tilt of the wafer 11, and the like. Also, the wafer stage 4 includes a plurality of reference mirrors (reflection parts) (not shown) corresponding to the X-, Y-, Z-, ωx-, ωy-, and ωz-directions on the side surfaces thereof. In contrast, the imprint apparatus 1 includes a plurality of laser interferometers (length-measuring devices) (not shown) that measures the position of the wafer stage 4 by irradiating these reference mirrors with beam. The laser interferometer measures the position of the wafer stage 4 in real time, and the control unit 7 to be described below executes positioning control of the wafer 11 (the wafer stage 4) based on the measurement value. Furthermore, the wafer stage 4 has a reference mark (not shown), which is used when the mold 8 is subjected to alignment, on the surface thereof.

The application unit 5 is installed near the mold holding mechanism 3 and applies the resin (uncured resin) 15 to the substrate-side pattern region (region to be processed) on which a pattern is to be formed. The substrate-side pattern region is a region pre-existing on the wafer 11 carried into the imprint apparatus (e.g., a region on which a pattern has already been formed in the previous layer. The region may also be referred to as a shot region. Here, the resin 15 is a photocurable resin (imprint material) having the property of being cured by being irradiated with the ultraviolet light 9, and is appropriately selected depending on various conditions such as the manufacturing process of semiconductor devices or the like. The amount of the resin 15 to be ejected from the ejection nozzle of the application unit 5 is also appropriately determined by a desired thickness of the resin 15 to be formed on the wafer 11, the density of the pattern to be formed, or the like.

The imprint apparatus 1 includes a correction unit that corrects the shape (including size) of the substrate-side pattern region on the wafer 11. The correction unit includes a heating mechanism (heating unit) 6 for heating the wafer 11, a scanning mechanism (scanning unit), and a control unit 7. In the present embodiment, the scanning mechanism is the wafer stage 4. The correction unit heats and deforms the wafer 11 to thereby match the shape of the substrate-side pattern region (target region) with that of the pattern region 8a. The heating mechanism 6 has a heating light source 20 that serves as a heat source for heating the wafer 11 and an adjustment mechanism (light quantity adjusting unit) 21 that adjusts a region (light quantity to be irradiated) in which light emitted from the heating light source 20 is irradiated on the wafer 11. Here, the heating light source 20 emits light with a wavelength (low sensitivity) at which the uncured resin 15 coated on the wafer 11 is not cured or the uncured resin 15 is difficult to be cured, where light is capable of imparting a temperature to the uncured resin 15 with the aid of the minimum necessary heat quantity. Examples of light employable for the heating light source 20 include infrared beam, ultraviolet light in a wavelength band at which the resin 15 is difficult to be cured, and the like. Employing such light is advantageous in that such light is less likely to impart the adverse effect of thermal disturbance to an optical path or the periphery of a substrate-side pattern region because such light can impart a temperature to the substrate-side pattern region or the mold 8 with the aid of the minimum necessary heat quantity as described above.

Figure 2:
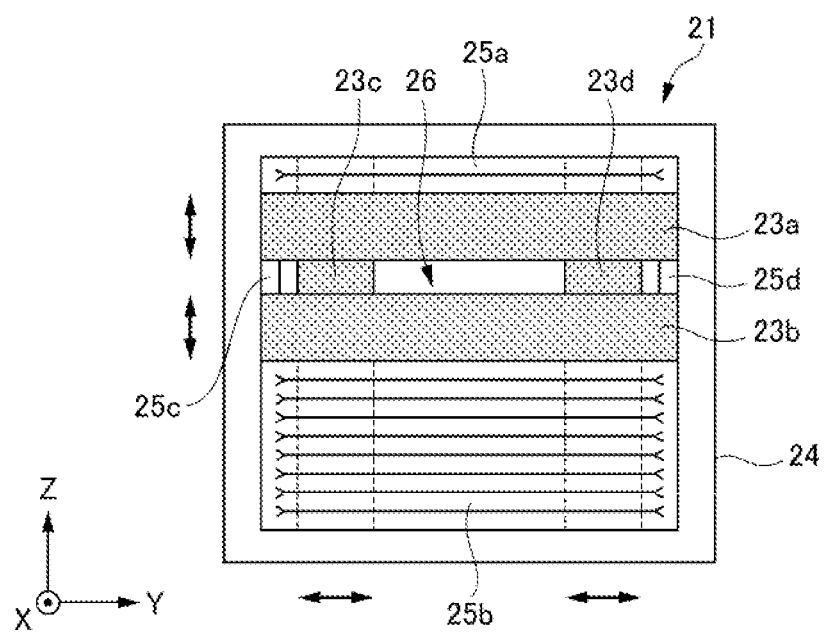
FIG. 2 is a diagram illustrating the configuration of a heating region adjustment mechanism according to the first embodiment.

FIG. 2 is a schematic diagram illustrating an example of a configuration of the adjustment mechanism 21. In FIG. 2, it is assumed that the heating light source 20 is provided behind the paper sheet and the state of the adjustment mechanism 21 is shown when the region through which heating light 22 emitted from the heating light source 20 passes is viewed from the front. The adjustment mechanism 21 has a first shielding member 23a and a second shielding member 23b that are movable in one axial direction (the Z-axis direction) in a plane perpendicular to the optical axis of the heating light 22 and a third shielding member 23c and a fourth shielding member 23d that are movable in the other axial direction (the Y-axis direction). The ends of the shielding members 23a to 23d are supported by a support frame 24, which is the body portion of the adjustment mechanism 21, as a guide, and are synchronously movable by a drive mechanism (shielding member drive unit) (not shown) based on the operation command from the control unit 7. As an exemplary power source employable for the drive mechanism of the adjustment mechanism 21, a linear motor or the like is preferred from the viewpoint of scanning accuracy and controllability.

Furthermore, the shielding members 23a to 23d are connected from the side surfaces in one traveling direction to the side surfaces of the support frame 24 through extendable members 25a to 25d, respectively. As the extendable members 25a to 25d, an extendable sheet member, a connecting member formed of a foldable bellow, and the like may be employed. With such configuration of the shielding members 23a to 23d and the extendable members 25a to 25d, the adjustment mechanism 21 may define a region surrounded by four shielding members 23a to 23d as the passing region 26 of the heating light 22 emitted from the heating light source 20. The passing region 26 corresponds to a region in which light emitted from the heating light source 20 is irradiated onto the wafer 11. The light quantity of light to be irradiated onto the wafer 11 increases with increase in an area of the passing region 26. In other words, the adjustment mechanism 21 has a function that adjusts heat quantity to be imparted to the wafer 11 by adjusting the light quantity of light to be irradiated onto the wafer 11.

From the viewpoints of the irradiation efficiency of the heating light 22 with respect to the substrate-side pattern region formed on the wafer 11, installability of the adjustment mechanism 21 having a drive mechanism, and the like, it is preferable that the heating mechanism 6 illuminates the heating light 22 along the irradiation direction of the ultraviolet light 9. More specifically, as shown in FIG. 1, the heating mechanism 6 may be provided at the upper part (the irradiation side of the ultraviolet light 9) of a bridge surface plate 32 (to be described below) for fixing and supporting the mold holding mechanism 3, whereas the light irradiation unit 2 may be provided at the further upper part of the heating mechanism 6. In this case, it is preferable that the heating light source 20 and the adjustment mechanism 21 are juxtaposed to each other such that the heating light 22 passed through the passing region 26 of the adjustment mechanism 21 enters the aperture region 14 in the horizontal direction on the basis of the plane of the bridge surface plate 32.

The control unit 7 may control the operation, adjustment, and the like of the components of the imprint apparatus 1. The control unit 7 is constituted by a control substrate including a CPU (MPU) and a memory and is connected to the components of the imprint apparatus 1 through a line so as to execute control of the components in accordance with a program or the like. The control unit 7 of the present embodiment controls at least the operation of the heating mechanism 6 and the synchronous operation of the wafer stage 4 attached to the operation of the heating mechanism 6. Note that the control unit 7 may be integrated with the rest of the imprint apparatus 1 (provided in a shared housing) or may be provided separately from the rest of the imprint apparatus 1 (provided in a separate housing).

Also, the imprint apparatus 1 includes an alignment measurement system (measurement unit) 30 that measures the position, shape, and the like of the pattern region 8a of the mold 8 and the substrate-side pattern region present on the wafer 11 during imprint processing. Furthermore, the imprint apparatus 1 includes a base surface plate 31 on which the wafer stage 4 is placed, a bridge surface plate 32 that fixes the mold holding mechanism 3, and a column 33 that extends from the base surface plate 31 and supports the bridge surface plate 32 via a vibration isolator. Furthermore, the imprint apparatus 1 may also include a mold conveyance mechanism (not shown) that conveys the mold 8 from the exterior of the imprint apparatus 1 to the mold holding mechanism 3 and a substrate conveyance mechanism (not shown) that conveys the wafer 11 from the exterior of the imprint apparatus 1 to the wafer stage 4.

Figure 3:
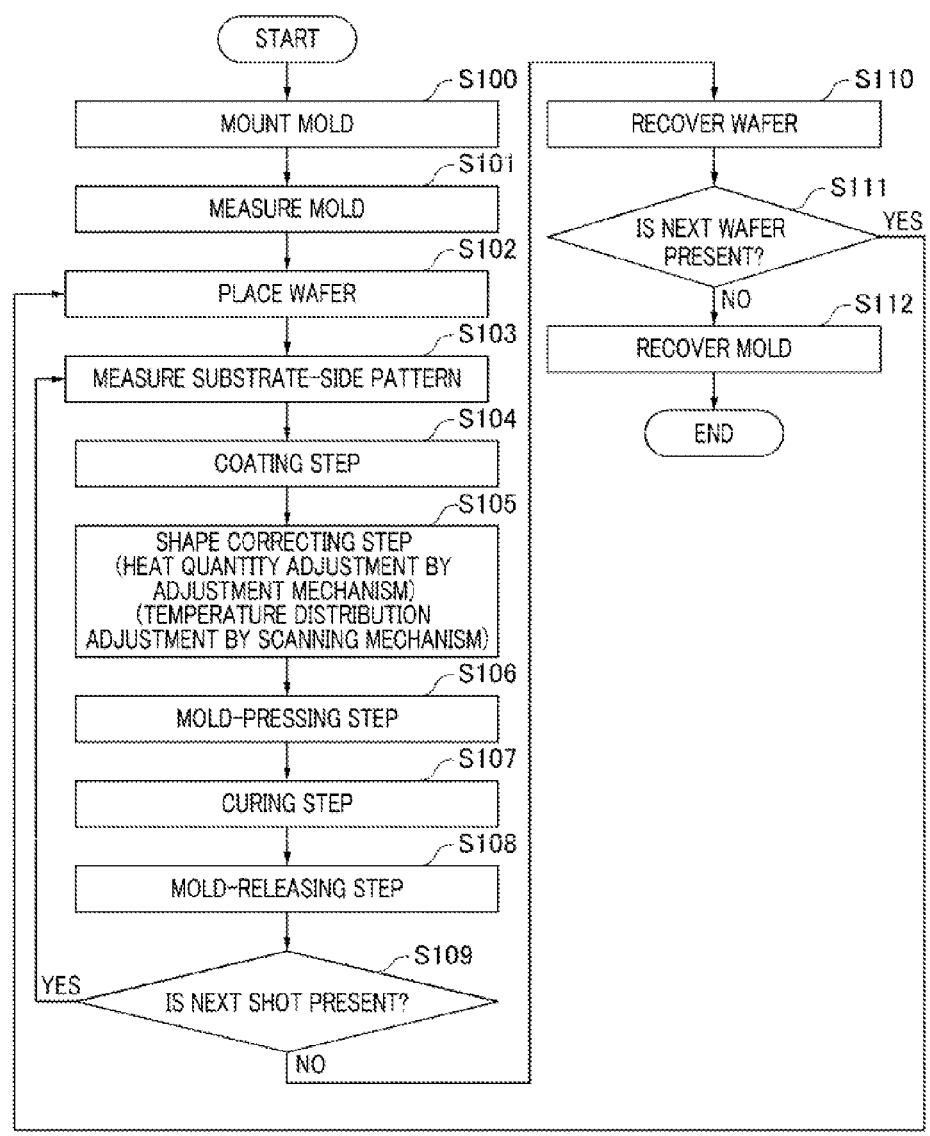
FIG. 3 is a flowchart illustrating the sequence of operations during imprint processing.

Next, a description will be given of the operation performed by the imprint apparatus 1. FIG. 3 is a flowchart illustrating the sequence of operations performed when a pattern is formed on the substrate-side pattern region on each of a plurality of wafers 11 serving as the substrates to be treated during imprint processing performed by the imprint apparatus 1. Also, the same mold 8 is intended to be used for a single lot including a plurality of wafers 11. Firstly, upon start of the sequence of operations, a mold conveyance mechanism conveys the mold 8 to the mold chuck 12 and mounts the mold 8 on the mold chuck 12 (step S100). Next, the control unit 7 causes an alignment measurement system to measure the mold 8 (step S101). More specifically, the alignment measurement system detects the reference mark provided on the wafer stage 4 and a plurality of alignment marks formed on the pattern region 8a and then the control unit calculates the position and the shape of the pattern region 8a based on the detection result. Next, a substrate conveyance mechanism conveys the wafer 11 prior to being subjected to processing to the wafer chuck 16 and mounts the wafer 11 on the wafer chuck 16 (step S102).

Next, the control unit 7 causes the alignment measurement system to measure the substrate-side pattern region (step S103). More specifically, the alignment measurement system detects a plurality of alignment marks formed on the wafer 11 and a plurality of alignment marks formed on the mold 8 and then the control unit calculates the position and the shape of the substrate-side pattern region based on the detection result. Then, the stage drive mechanism 17 moves the wafer 11 such that the substrate-side pattern region on the wafer 11 is positioned at an application position at which the application unit 5 applies the resin 15. Next, the application unit 5 applies the uncured resin 15 to the substrate-side pattern region (application step: step S104). Then, the stage drive mechanism 17 moves the wafer 11 such that the substrate-side pattern region on the wafer 11 is positioned at the pressing position directly below the pattern region 8a formed on the mold 8. Note that the aforementioned operation is just an example and the present invention is not limited thereto. Although the position and the shape of the substrate-side pattern region is measured within the imprint apparatus 1 in step S103 in the example shown in FIG. 3, the position and the shape of the substrate-side pattern may be measured in advance by another externally provided device other than the imprint apparatus.

Next, the control unit 7 matches the shape of the substrate-side pattern region on the wafer 11 with the shape of the pattern region 8a on the mold 8. At this time, the control unit 7 firstly calculates the correction deformation amount of the shape of the substrate-side pattern region with respect to the shape of the pattern region 8a with reference to the shape of the pattern region 8a acquired in step S101 and the shape of the substrate-side pattern region acquired in step S103. Then, the control unit 7 controls the heating mechanism 6 and the wafer stage 4 based on the correction deformation amount to thermally change the shape of the substrate-side pattern region to thereby correct the shift of the substrate-side pattern region relative to the shape of the pattern region 8a (shape correcting step: step S105). While, in the above example, the control unit 7 acquires information regarding the correction deformation amount by calculation, the control unit 7 may also acquire information regarding the correction deformation amount by receiving information regarding the correction deformation amount from external.

Figure 4A:
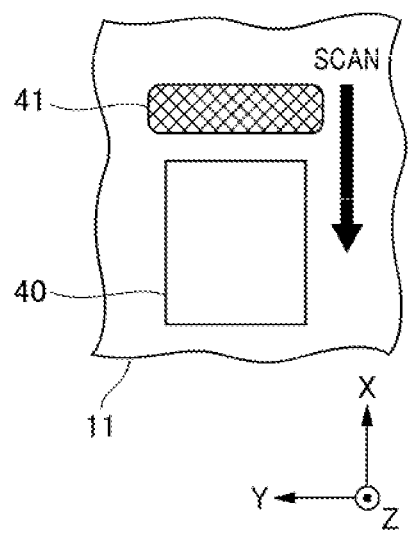
FIGS. 4A and 4B are diagrams illustrating a substrate-side pattern and a heating region on a wafer, respectively.
Figure 4B:
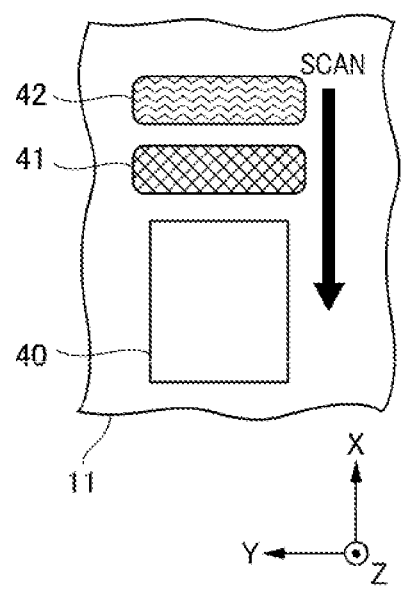

Here, a description will be given of the operation performed by the heating mechanism 6 in the shape correcting step. Firstly, the heating mechanism 6 causes the heating light source 20 to emit the heating light 22 based on the irradiation start command from the control unit 7. Next, the heating mechanism 6 causes the adjustment mechanism 21 to adjust the size (area) of the passing region 26 of the heating light 22 based on the heating region adjustment command from the control unit 7. FIGS. 4A and 4B are schematic plan views illustrating the wafer 11 on which a substrate-side pattern region 40 has been formed as partially viewed from the irradiation side of the heating light 22. In particular, FIG. 4A shows a heating region 41 to be formed on the wafer 11 by the heating mechanism 6 and the scanning direction of the heating region 41 with respect to the substrate-side pattern region 40 in this case. The heating region 41 is a region determined in accordance with the passing region 26 and represents a region of light to be irradiated onto the wafer 11. The heating region 41 has an area smaller than that of the pattern region 8a on the mold 8. Firstly, the wafer stage 4 moves such that the heating region 41 is positioned at a region (outer peripheral portion) outside the substrate-side pattern region 40 (in the state shown in FIG. 4A). Next, the heating mechanism 6 heats the outer peripheral portion of the substrate-side pattern region 40 to thereby impart temperature distribution to the substrate-side pattern region 40 by means of heat transferred by heat conduction. Furthermore, the wafer stage 4 moves in the upward direction in FIG. 4A so as to change the relative position between the substrate-side pattern region 40 and the heating region 41. In other words, the wafer stage 4 scans the heating region 40 in the downward direction in FIG. 4A with respect to the substrate-side pattern region 40. The heating mechanism 6 adjusts the size of the passing region 40 during scanning to thereby generate temperature distribution in the substrate-side pattern region 40. In the present embodiment, the scanning speed is constant but the present invention is not limited thereto. The shape of the substrate-side pattern region 40 can be corrected by adjusting the transmission region 26 in accordance with the deformation correction amount.

The correction by heating is preferably used for correcting a low-order shape such as a trapezoidal component or the like. Temperature distribution can have a constant gradient in the substrate-side pattern region 40 by starting scanning in a state where the heating region 41 is located outside the substrate-side pattern region 40. In the configuration of the adjustment mechanism 21 shown in FIG. 2, the first shielding member 23a and the second shielding member 23b are arranged parallel to each other and the third shielding member 23c and the fourth shielding member 23d are arranged parallel to each other. However, they are not necessarily arranged parallel to each other. The control unit 7 may control such that the spacing between the shielding members is wide for a region that requires a large heat quantity, whereas the spacing between the shielding members is narrow for a region that does not require such a large heat quantity. Furthermore, in the present embodiment, the wafer stage 4 is employed as the scanning mechanism and thus imparting of temperature distribution as described above can be realized by the simple apparatus configuration.

Figure 5:
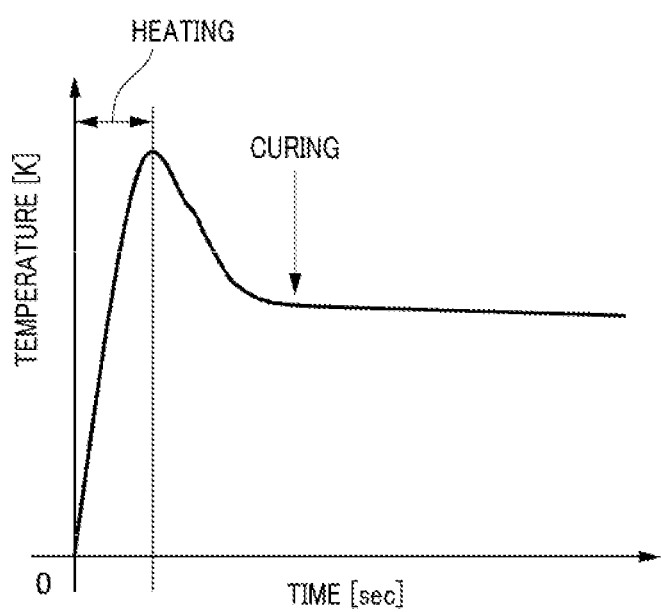
FIG. 5 is a graph illustrating the temperature variation of a substrate-side pattern at one location.

Here, FIG. 5 is a graph illustrating the temperature variation of the substrate-side pattern region 40 at one location, where the time is plotted on the horizontal axis and the temperature is plotted on the vertical axis. As shown in FIG. 5, when the substrate-side pattern region 40 is heated for a fixed time and then is stopped heating, the temperature on the substrate-side pattern region 40 rises abruptly in accordance with the heating time and then gradually falls. Thus, the control unit 7 forecasts the temperature variation of the substrate-side pattern region 40 from the heating step performed by the heating mechanism 6 to the subsequent curing step and refers to the forecast in the shape correcting step. In other words, the control unit 7 refers to the forecasted temperature variation and imparts the substrate-side pattern region 40 to heat quantity while adjusting the operation of the adjustment mechanism 21, whereby the shape of the substrate-side pattern region 40 can be corrected to a desired shape upon completion of the curing step.

It is preferable that the shape correcting step is carried out prior to the mold-pressing step to be described below. This is because the deformation resistance of the substrate-side pattern region 40 becomes small by heating the substrate-side pattern region 40 with the substrate-side pattern region 40 not being contacted with the pattern region 8a and thus the substrate-side pattern region 40 can be deformed smoothly. The mold 8 may also be deformed (bent) by causing the pressure adjusting device to adjust the pressure in the space in contact with the mold 8 before the process shifts to the subsequent mold-pressing step after completion of the shape correcting step. Furthermore, deformation of the mold 8 by the pressure adjusting device and correction by the correction unit may be made in combination. Also, although heating by the heating mechanism 6 is performed through the mold 8 in the present embodiment, a heating light source may also be provided between the mold 8 and the application unit 5. With such configuration, the shape correcting step can be performed between the application step and the mold-pressing step to be described below. In other words, heating can be performed while the wafer stage 4 is moving between below the application unit 5 and below the mold 8, resulting in an improvement in throughput. Also, light emitted from the heating mechanism 6 does not have to be introduced into the optical path of the light source 10, a light reducing effect due to an optical element such as a half mirror or the like can be reduced. When a heating light source is provided between the mold 8 and the application unit 5, a portion of light emitted from the light source 10 may also be used for heating.

Next, the mold drive mechanism 13 presses the mold 8 (the pattern region 8a) against the resin 15 on the wafer 11 (mold-pressing step: step S106). Next, the light irradiation unit 2 collectively irradiates the resin 15 pressed against the mold 8 with the ultraviolet light 9 to thereby cure the resin 15 (curing step: step S107). Next, the mold drive mechanism 13 releases the mold 8 (the pattern region 8a) from the resin 15 on the wafer 11 (mold-releasing step: step S108). Next, the control unit 7 executes determination on whether or not there is a shot, on which a pattern is to be successively formed, on the wafer 11 (step S109). When the control unit 7 determines that there is a new shot, the process shifts to step S103. Next, when the control unit 7 determines in step S109 that there is no new shot, the control unit 7 causes the substrate conveyance mechanism to recover the wafer 11 from the wafer chuck 16 (step S110). Next, the control unit 7 executes determination on whether or not there is a wafer 11 to be successively treated. When the control unit 7 determines that there is a new wafer 11 (step S111), the process shifts to step S102. When the control unit 7 determines in step S111 that there is no new wafer 11, the control unit 7 causes the mold conveyance mechanism to recover the mold 8 from the mold chuck 12 (step S112), and the sequence of operations ends.

While, in the shape correcting step in step S105, the wafer stage 4 serving as the scanning mechanism is driven so as to scan the substrate-side pattern region 40, a pair of shielding members 23a and 23b of the adjustment mechanism 21 may also be driven so as to scan the heating region 41. By scanning the heating region 41 by driving the shielding members 23a and 23b and adjusting the size of the passing region 26 by driving the shielding members 23c and 23d, temperature distribution can be achieved in the substrate-side pattern region 40 even if the wafer stage 4 is stopped. With this arrangement, the wafer stage 4 is not driven in the shape correcting step, which may be advantageous for lowering power consumption and so on.

In contrast, if the configuration is set for scanning the heating region 41 using the adjustment mechanism 21, the pattern region 8a on the mold 8 can be set as the target region to be deformed instead of the substrate-side pattern region 40. In this case, the object to be heated by the heating mechanism 6 is not the wafer 11 but the mold 8. More specifically, the adjustment mechanism 21 drives a shielding member on the surface of the mold 8 (the back side of the surface on which the pattern region 8a is formed) such that the heating region 41 moves on a region corresponding to the pattern region 8a. Also in this case, the shape of the pattern region 8a can be matched with the shape of the substrate-side pattern region 40 with reference to the position and the shape of the pattern region 8a acquired in step S101, the position and the shape of the substrate-side pattern acquired in step S103, and the like. Furthermore, it is preferable that the substrate-side pattern region 40 is not present below the pattern region 8a by driving the wafer stage 4.

As described above, in the present embodiment, the heating mechanism 6 changes the heat quantity to be imparted to the wafer 11 per unit time in accordance with scanning by adjusting the size of the passing region 26. However, the method for changing heat quantity is not limited thereto. For example, heat quantity may also be adjusted by another method. For example, the output (light quantity) of the heating light source 20 may be adjusted in accordance with scanning or may also be adjusted by providing a heating light adjustment mechanism (not shown) between the heating light source 20 and the adjustment mechanism 21. Light quantity distribution within the heating region 41 may also be adjusted.

As described above, the imprint apparatus 1 corrects at least any one of the substrate-side pattern region 40 and the pattern region 8a thermally by means of the heating mechanism 6 and the scanning mechanism when the shape of the substrate-side pattern region 40 is matched with the shape of the pattern region 8a during imprint processing. According to the present embodiment, the heating light source 20 and the adjustment mechanism 21 are employed as the heating mechanism 6 and an existing wafer stage 4 is employed as a scanning mechanism. In other words, in comparison with a mechanism for thermally correcting the shape of the substrate-side pattern region 40 or the shape of the pattern region 8a provided in a conventional imprint apparatus, a cost for installing these mechanisms can be reduced, and thus, the imprint apparatus 1 may also be advantageous for achieving the simplification of control.

Thus, according to the present embodiment, an imprint apparatus that is advantageous for simplifying a mechanism for thermally correcting the shape of the substrate-side pattern region 40 pre-existing on the wafer 11 or the shape of the pattern region 8a formed on the mold 8 may be provided.

Second Embodiment

Next, a description will be given of an imprint apparatus according to a second embodiment of the present invention. In the sequence of operations described in the first embodiment, the process shifts to a curing step through a mold-pressing step after completion of the shape correcting step in step S105, and the control unit 7 causes the light irradiation unit 2 (curing unit) to collectively irradiate the resin 15 on the substrate-side pattern region 40 with the ultraviolet light 9 for curing. In contrast, a feature of the imprint apparatus of the present embodiment lies in the fact that the shape correcting step and the curing step are simultaneously performed during or after the pressing operation for pressing the resin 15 against the pattern region 8a in the mold-pressing step. In the present embodiment, no further description will be given of the same configuration and control as those of the first embodiment. FIG. 4B shows a curing region 42 to be formed on the wafer 11 by the light irradiation unit 2 and the scanning direction of the heating region 41 and the curing region 42 with respect to the substrate-side pattern region 40 in this case. The curing region 42 is a region having a smaller area than that of the pattern region 8a on the mold 8. In this case, when referring to the sequence of operations of the first embodiment, the control unit 7 shifts the process to the next mold-pressing step after completion of the application step in step S104.

During or after the pressing operation in the mold-pressing step, the control unit 7 causes the light irradiation unit 2 to form the curing region 42 at a position adjacent to the heating region 41 and at a position downstream in the scanning direction toward the substrate-side pattern region 40 as shown in FIG. 4B. In other words, the heating region 41 and the curing region 42 are juxtaposed to each other in the scanning direction. Then, the control unit 7 also performs the scanning of the curing region 42 concurrently with the scanning of the heating region 41 in the shape correcting step. During the scanning, the curing region 42 travels following a portion on which the heating region 41 for heating the substrate-side pattern region 40 has passed. Thus, the imprint apparatus of the present embodiment can cure the resin 15 on the substrate-side pattern region 40 in succession from a portion of the substrate-side pattern region 40 subjected to shape correction by the passage of the heating region 41. As described above, according to the present embodiment, the same effects as those of the first embodiment can be provided and a higher throughput can be achieved by shortening processes. The irradiation area, i.e., the light quantity of the curing region 42 only needs be able to cure the resin 15, and thus, does not need to be strictly controlled in contract to the case of forming the heating region 41.

On the other hand, the shape correcting step and the curing step may also be performed simultaneously by using ultraviolet light for curing the resin 15 as light to be employed to the heating light source 20. If the light source for emitting ultraviolet light is employed as the heating light source 20, the commonality of the light source of the light irradiation unit 2 and the heating light source 20 can be achieved. At this time, a heating region and a curing region to be formed on the substrate-side pattern region 40 can be set in common, the control unit 7 executes control of a common light source such that the heat quantity required for deforming the substrate-side pattern region 40 is added to the light quantity required for curing the resin 15. By irradiating the substrate-side pattern region 40 with light by means of the heating light source 20 from the outside of the substrate-side pattern region 40, the substrate-side pattern region 40 can be subject to shape correction in succession from the region of the substrate-side pattern region 40 in the +X-axis direction through heat transfer. In accordance with this configuration, there is no need to provide a new heating light source 20, and thus, the configuration of a mechanism for thermally correcting the shape of the substrate-side pattern region 40 can further be simplified by employing the light source of the light irradiation unit 2 as the heating light source. Furthermore, when a region to be heated and cured is scanned on the substrate-side pattern region 40, the measurement of the substrate-side pattern region 40 and the shape correcting step are simultaneously performed concurrently with the curing step, whereby shape correction can be performed with high accuracy. By measuring the position of the substrate-side pattern region 40 in advance using another apparatus prior to the processes performed by the imprint apparatus 1, the imprint apparatus 1 can be simplified in structure.

Third Embodiment

Figure 6:
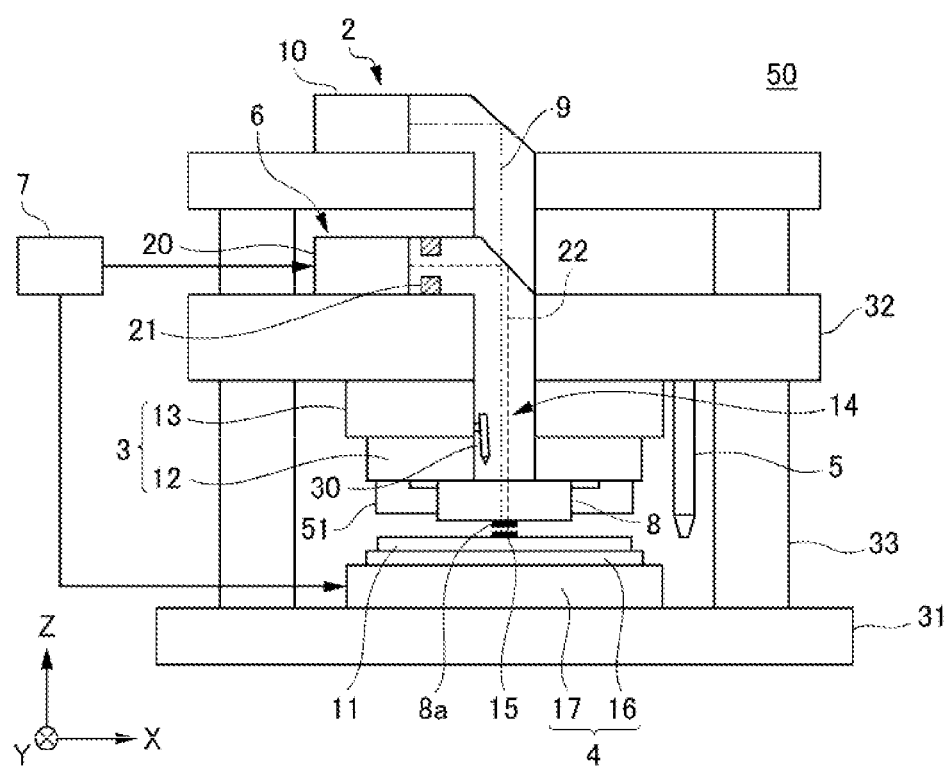
FIG. 6 is a diagram illustrating the configuration of an imprint apparatus according to a third embodiment of the present invention.

Next, a description will be given of an imprint apparatus according to a third embodiment of the present invention. In the first embodiment, when the shape of the substrate-side pattern region 40 is matched with the shape of the pattern region 8a, the shape of the substrate-side pattern region 40 or the shape of the pattern region 8a is thermally corrected by use of the heating mechanism 6. In contrast, a feature of the imprint apparatus of the present embodiment lies in the fact that the mold 8 (the pattern region 8a) is subject to mechanical shape correction by use of a magnification correction mechanism in addition to thermal shape correction as described above. In the present embodiment, no further description will be given of the same configuration and control as those of the first embodiment. FIG. 6 is a schematic diagram illustrating the configuration of an imprint apparatus 50 of the present embodiment. The imprint apparatus 50 has substantially the same configuration as that of the imprint apparatus 1 of the above embodiment except that the mold chuck 12 constituting the mold holding mechanism 3 has a magnification correction mechanism (mold correction mechanism) 51 that deforms the shape of the pattern region 8a by imparting an external force to the mold 8. A plurality of actuators is preferably used as the magnification correction mechanism 51. In this case, when referring to the sequence of operations of the first embodiment, the control unit 7 causes the magnification correction mechanism 51 to execute a second shape correcting step before or after the shape correcting step in step S105 or during or after the pressing operation in the mold-pressing step.

At this time, the control unit 7 calculates the deformation correction amount based on the measurement results of the position and the shape obtained in steps S101 and S103. Then, the control unit 7 performs correction by the calculated deformation correction amount by performing shape correction in the shape correcting step in step S105 and shape correction in the second shape correcting step. With this arrangement, the same effects as those of the first embodiment can be provided and heat diffusion to the periphery of the substrate-side pattern region 40 can be reduced in comparison with the case of shape correction only by heat in step S105. Here, in the second shape correcting step of correcting the shape of the pattern region 8a by an external force, a high-order shape deviation is readily corrected. Thus, for example, it is preferable that a trapezoidal component (low-order shape deviation) with a large deformation correction amount is thermally corrected in the shape correcting step and other shape components are mechanically corrected in the second shape correcting step. Thus, the control unit 7 may extract (acquire) a low-order component (first information) and a high-order component (second information) from the deformation correction amount based on the measurement results so as to use these extracted components in the shape correcting step. Examples of a low-order shape include a deformation component such as an arcuate component, a barrel-shaped component, a pincushion component, or the like other than a trapezoidal component. As an example of the order of the shape correcting step, the second shape correcting step performed by the magnification correction mechanism 51 may be performed prior to the shape correcting step in step S105 in consideration of responsiveness. In the above embodiments, a description has been given of simultaneous execution of the measurement of the substrate-side pattern region 40 and the shape correcting step concurrently with the curing step when a region to be heated and cured is scanned on the substrate-side pattern region 40. Likewise, when a region to be heated and cured is scanned on the substrate-side pattern region 40, the measurement of the substrate-side pattern region 40 and the second shape correcting step may also be simultaneously performed concurrently with the curing step. Furthermore, correction can be made with high accuracy by performing at least either one of shape correcting steps: the second shape correcting step or the shape correcting step in step S105.

Fourth Embodiment

Figure 7:
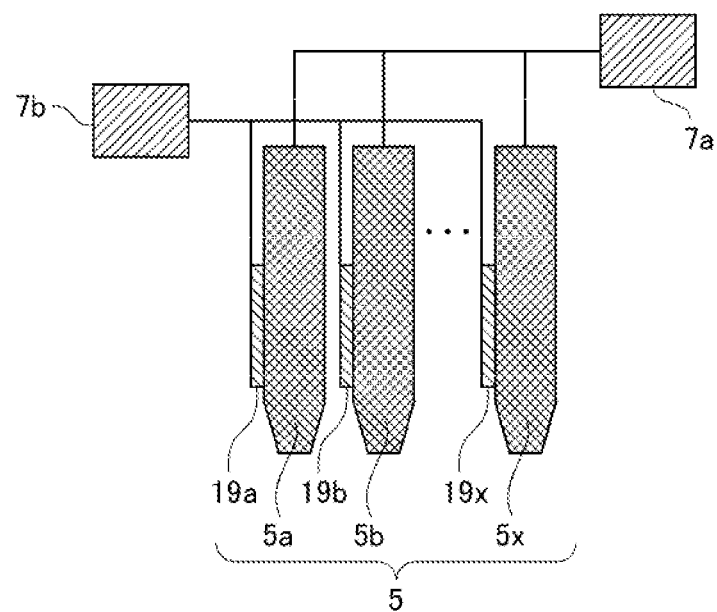
FIG. 7 is a diagram illustrating the configuration of an imprint apparatus according to a fourth embodiment of the present invention.

Next, a description will be given of an imprint apparatus according to a fourth embodiment of the present invention. The imprint apparatus of the present embodiment includes a heating mechanism that is different from those described in the first to third embodiments, and the heating mechanism includes a heater that heats the resin 15 ejected from the ejection nozzle of the application unit 5. In the present embodiment, no further description will be given of the same configuration and control as those of the first embodiment. FIG. 7 is a diagram illustrating the configuration of the heating mechanism of the present embodiment. The application unit 5 includes a plurality of ejection nozzles (ejection ports) 5a to 5x, the heating mechanism includes a plurality of heaters (heat sources) 19a to 19x, and each heater heats the resin 15 ejected from each ejection nozzle. An application control unit 7a controls the amount of the resin 15 applied and a temperature control unit 7b controls temperature of the heaters 19a to 19x. Temperature distribution may be imparted to the resin 15 applied from the application unit 5 onto the wafer 11 by controlling the temperature of the heaters 19a to 19x different from each other. Note that the region in which the resin 15 is applied from the application unit 5 at once is smaller than the pattern region 8a on the mold 8 and the substrate-side pattern region 40. The application unit 5 applies the resin 15 to the substrate-side pattern region 40 while scanning the substrate-side pattern region 40 by means of the wafer stage 4 (scanning unit), whereby the resin 15 can be coated onto the entire surface of the substrate-side pattern region 40.

According to the present embodiment, the resin 15 is applied to the substrate-side pattern region 40 while controlling the temperature of each of the heaters 19a to 19x, whereby the heating mechanism changes the heat quantity to be imparted to the wafer 11 per unit time in accordance with scanning. Thus, a temperature distribution can be imparted to the substrate-side pattern region 40.

Fifth Embodiment

Next, a description will be given of an imprint apparatus according to a fifth embodiment of the present invention. The imprint apparatus of the present embodiment includes a second heating mechanism in addition to the heating mechanism (first heating mechanism) described in the first to fourth embodiments. In the present embodiment, no further description will be given of the same configuration and control as those of the first embodiment. The second heating mechanism is any one of heating mechanisms described in the first to fourth embodiments and has a different configuration from that of the first heating mechanism. The configuration of the first heating mechanism and the second heating mechanism can be combined as appropriate.

The control unit 7 of the imprint apparatus acquires first heating information regarding the deformation correction amount, controls the first heating mechanism based on the first heating information, acquires second heating information regarding the deformation correction amount, and controls the second heating mechanism based on the second heating information. The second heating information is, for example, a deformation correction amount stored in a storage unit in advance, whereas the first heating information is, for example, a deformation correction amount calculated from the measurement results in step S101 or S103. In this manner, the coarse correction can be made using the second heating mechanism and the fine tuning of correction can be made by a smaller heat quantity than that required for the second heating mechanism using the first heating mechanism.

According to the present embodiment, the shape of the substrate-side pattern region is corrected using the second heating mechanism together with the first heating mechanism, the burden on the first heating mechanism can be reduced. In other words, the first heating mechanism can be reduced in size, whereby unintended heat transferred from the first heating mechanism to the peripheral portion can be reduced.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-015558 filed on Jan. 27, 2012, and Japanese Patent Application No. 2013-006827 filed on Jan. 18, 2013, which are hereby incorporated by reference herein in their entirety.

What is claimed is:

1. An imprint apparatus that forms a pattern of a resin on a region to be processed of a substrate using a mold including a pattern region on which a pattern is formed, the imprint apparatus comprising:

a correction unit configured to correct a shape of a target region that is either the pattern region on the mold or the region to be processed on the substrate, wherein the correction unit further includes:

a first heating unit configured to heat the target region, the first heating unit including a light quantity adjusting unit configured to adjust a light quantity of light emitted from a light source;

a scanning unit configured to scan a heating region having an area smaller than that of the pattern region on the mold with respect to the target region; and a control unit configured to acquire information regarding a deformation amount for correcting a shape of the target region and control the first heating unit and the scanning unit based on the information, wherein the light quantity adjusting unit is configured to adjust the light quantity of the light in accordance with scanning the heating region.

2. The imprint apparatus according to claim 1, wherein the light quantity adjusting unit is configured to change a heat quantity of light irradiated onto the target region in accordance with scanning the heating region.

3. The imprint apparatus according to claim 1, wherein the light quantity adjusting unit is configured to be arranged between the light source and the target region, includes a shielding member that shields a portion of light emitted from the light source, and is configured to adjust the light quantity of the light by moving the shielding member in accordance with scanning the heating region.

4. The imprint apparatus according to claim 3, wherein the light quantity adjusting unit includes a first shielding member and a second shielding member configured to be movable along a first direction in a plane perpendicular to a light axis of the light and a third shielding member and a fourth shielding member configured to be movable along a second direction perpendicular to the first direction in the plane.

5. The imprint apparatus according to claim 1, wherein the control unit is configured to control the scanning unit to start scanning in a state where the heating region is located outside the target region.

6. The imprint apparatus according to claim 1,
wherein the scanning unit is arranged between the light source and the object, and
wherein the imprint apparatus further includes a pair of shielding members configured to shield a portion of light emitted from the light source, and is configured to cause the heating region to scan in the target region by moving the shielding members.

7. The imprint apparatus according to claim 1, wherein the target region is the region to be processed on the substrate and the scanning unit includes a moving body driving unit configured to drive a moving body that is movable while holding the substrate.

8. The imprint apparatus according to claim 6, further comprising:
a curing unit configured to cure a resin in a curing region having an area smaller than that of the pattern region on the mold, and provided on the substrate,
wherein the target region is the region to be processed on the substrate, the heating region and the curing region are juxtaposed to each other on the substrate in the scanning direction of the scanning unit, and the curing region passes over the region to be processed after the heating region has passed over the region to be processed during scanning by the scanning unit.

9. The imprint apparatus according to claim 1, further comprising:
an application unit including a plurality of ejection ports and configured to apply the resin ejected via the plurality of ejection ports to the substrate,
wherein the target region is the region to be processed on the substrate, and the first heating unit includes a heat source configured to heat the resin ejected from the plurality of ejection ports.

10. The imprint apparatus according to claim 1,
wherein the correction unit further includes a plurality of actuators configured to apply a force to the mold, and
wherein the control unit is configured to acquire second information regarding the deformation amount for correcting a shape of the pattern region on the mold and control the plurality of actuators based on the second information.

11. The imprint apparatus according to claim 1, further comprising:
an application unit configured to apply the resin to the substrate;
a mold holding unit configured to hold the mold;
a moving body configured to be movable while holding the substrate; and
a second heating unit configured to heat the substrate,
wherein the target region is the region to be processed on the substrate, and
wherein the control unit is configured to acquire first and second heating information regarding a deformation amount for correcting a shape of the region to be processed, control the first heating unit and the scanning unit based on the first heating information, and control the second heating unit based on the second heating information.

* * * * *